(12) United States Patent
Shepard (10) Patent No.: US 10,753,651 B1
(45) Date of Patent: Aug. 25, 2020

(54) SOLAR OVER FIBER AND WATER BASED WAVEGUIDES (71) Applicant: Scott Shepard, Kansas City, MO (US)

(72) Inventor: Scott Shepard, Kansas City, MO (US)

( * ) Notice: Subject to any disclaimer, the term of this patent is extended or adjusted under 35 U.S.C. 154(b) by 56 days.

(21) Appl. No.: 16/156,303

(22) Filed: Oct. 10, 2018

Related U.S. Application Data (60) Provisional application No. 62/572,879, filed on Oct. 16, 2017.

(51) Int. Cl.
| | | |
|---|---|---|
| *H01L 31/052* | (2014.01) | |
| *G02F 1/365* | (2006.01) | |
| *H01S 3/067* | (2006.01) | |
| *F24S 80/00* | (2018.01) | |
| *H02S 40/44* | (2014.01) | |
| *H02S 40/22* | (2014.01) | |
| *F24S 70/10* | (2018.01) | |
| *F24S 20/80* | (2018.01) | |
| *F24S 23/00* | (2018.01) | |
| *F24S 20/70* | (2018.01) | |

(52) U.S. Cl.
CPC .............. *F24S 80/00* (2018.05); *F24S 20/70* (2018.05); *F24S 20/80* (2018.05); *F24S 23/12* (2018.05); *F24S 70/10* (2018.05); *H02S 40/22* (2014.12); *H02S 40/44* (2014.12)

(58) Field of Classification Search
CPC .. F24S 80/00; F24S 20/70; F24S 20/80; F24S 23/12; F24S 70/10; H02S 40/22; H02S 40/44
See application file for complete search history.

(56) References Cited

U.S. PATENT DOCUMENTS

| 8,710,353 | B2 | 4/2014 | Shepard | |
|---|---|---|---|---|
| 2007/0107884 | A1* | 5/2007 | Sirkar | F28D 7/1669 165/133 |
| 2009/0314333 | A1* | 12/2009 | Shepard | H01L 31/0547 136/248 |
| 2012/0118380 | A1* | 5/2012 | Leaback | D01F 8/00 136/259 |
| 2013/0008430 | A1* | 1/2013 | Lee | F22B 1/006 126/600 |

OTHER PUBLICATIONS

Colfax, Solar Balloons: Future of Alternative Energy, Sep. 2008, retrieved from http://www.coolearthsolar.com/solar-balloons-future-alternative-energy, 4 pages.

* cited by examiner

*Primary Examiner* — Jayne L Mershon
(74) *Attorney, Agent, or Firm* — Brian S. Steinberger; Hilary F. Steinberger; Law Offices of Brian S. Steinberger, P.A.

(57) ABSTRACT

Systems, devices and methods for increasing the concentration level, longevity and efficiency of photovoltaic (PV) systems via optical filtering waveguides. The waveguides can transfer absorbed heat via steam (or other gasses) and water (or other liquids) for subsequent solar thermal (ST) energy conversion and provide low-loss transmission of the filtered light over a grid of PV systems. These include new balloon/bulb type collectors interfacing with the optical filtering waveguides which then mode-couple solar energy into the PVs.

20 Claims, 9 Drawing Sheets

FIG. 3 (a) (iii)

FIG. 3 (b) (iii)

FIG. 6 (b) (iii)

FIG. 6 (c) (iii)

SOLAR OVER FIBER AND WATER BASED WAVEGUIDES

RELATED APPLICATION

This application claims the benefit of priority to U.S. Provisional Application Ser. No. 62/572,879 filed Oct. 16, 2017, the entire disclosure of which is incorporated herein by specific reference thereto.

FIELD OF INVENTION

This invention relates to solar energy, and in particular to methods, devices and systems for increasing the concentration level, longevity and efficiency of photovoltaic (PV) systems via optical filtering waveguides which transfer the absorbed heat via steam (or other gasses) and water (or other liquids) for subsequent solar thermal (ST) energy conversion and to distribute the filtered light over a grid of PV systems.

BACKGROUND AND PRIOR ART

It is well known that plastic is cheaper than silicon so the question is why not collect a large amount of sunlight and focus it via a cheap flat plastic Fresnel lens onto silicon PVs (photovoltaics)? Well we do such, called CPV (concentrated PV) but the problem is we're also concentrating the out-of-band infrared, (IR), and ultraviolet, (UV), spectral components which do not create electricity. Instead these create heat which warms up the PV and its conversion efficiency plummets. Thus, CPV systems utilize heat sinks, often running water through the heat sinks, to cool the system but that is expensive and cumbersome.

CPV systems also typically use multi-junction PVs and materials other than silicon in order to extend their responsivity further into the IR and the UV but these are expensive and there is always some out-of-band energy remaining which heats up the system and limits its efficiency. We prefer to remove the heat sources from the sunlight before it even hits the PV and hence utilize some type of optical filtering. This is also done but the optical filters are placed on top of the PV and so they still conduct a lot of heat into the PV.

We have found (see U.S. Pat. No. 8,710,353 to Shepard, which is incorporated by reference in its' entirety) that via the use of optical waveguides (e.g., bundles of optical fiber) as filtering elements; we can absorb the out-of-band spectral components, thereby converting them into heat which is either conducted into solar-thermal energy converters or radiated into the air so that the heat is not conducted to the PV. This permits higher levels of concentration (thereby pushing the "plastic is cheaper than silicon" advantage) while also eliminating the need for heat sinking systems on the PV.

Currently losses in the visible range of the spectrum are too high to permit "solar over fiber" except for short distances. Herein we solve that problem, thereby enabling secure optical power distribution networks (which have many advantages over their electrically cabled counterparts) and extend the capabilities of waveguide filters for PV and solar-thermal systems.

Enabling low-loss transmission of visible frequencies over optical waveguides also greatly expands on the capabilities of prior art in the area of balloon-type solar collectors. Currently these place PVs at the focal point of an inflatable balloon which has a reflective surface to form a mirrored collector. See Colfax, Tyler, Solar Balloons: Future of Alternative Energy, 23 Sep. 2008.

Our new balloon-type solar collectors however place our new optical waveguides at the focal point. These can be lightweight and so can extend high into the sky or even float. Note that such large-scale balloon type collectors are only feasible when used in conjunction with our new optical cabling methods. The weight alone of PVs placed inside such a large-scale buoyant balloon would be prohibitive; and at such high optical intensities these would require extensive cooling systems and thick electrical cabling which further prohibit the prior art from "harvesting the sky" in such a way.

We also expand on the capabilities of prior art via mode-coupling the solar energy into the PVs—rather than just shining the light onto a PV in which case a large amount reflects. In our embodiments the PVs can receive all of the light imported to them via our waveguides.

Moreover, our optical power cabling cannot "short circuit" in water while it safely distributes power to PVs on land or inside buildings. Thus, we enable the floatation of balloon/bulb type collectors on a body of water, whereas electrical cabling from PVs placed over water is a daunting proposition. Just as our solar balloons minimize the terrestrial footprint by expanding the collector into the sky, they can also take advantage of the fact that area on water is often less expensive real-estate than the same area on land. The direction insensitivity of some of our novel collectors simplifies their application to turbulent water; and installation costs (on land or water, or from a window, car or backpack) can be reduced to those of simply "blowing up a balloon."

Thus, the need exists for solutions to the above problems with the prior art.

SUMMARY OF THE INVENTION

A primary objective of the invention is to provide systems, devices and methods for transmitting solar energy over various waveguides, coupling heat into water and coupling filtered solar spectrum into photovoltaics. These include but are not limited to: steam filled photonic crystal fiber; steam densities controlling the coupling of modes in various regions of arrays of glass tubes; and steam in metallic and plastic ducting which contain one or a plurality of various types of optical waveguides. Herein by "steam" we refer to water vapor of any density from normal air to liquid water which possibly could contain additives such as salts or contaminants or other mater—in vapor, liquid or solid phases.

A secondary objective of the invention is to provide many ways of enhancing the collection of solar energy; and after optical transmission over our new low-loss, spectrally-filtering waveguides; the coupling of such filtered solar energy into PVs and the transfer of heat into solar-thermal (ST) energy converters. These include but are not limited to: flexible balloon or rigid bulb type collectors enhanced by a controlled steam density; the retrofitting of existing ST systems with a section of water in a glass tube around which a flexible PV is wrapped; the use of arrays of end-fired glass tubes as collectors which then can function as, or are formed into, waveguides which then can be shaped into a glass cover on PVs into which filtered solar energy is mode-coupled; and the use of scattering and stimulated scattering processes to aid in solar collection.

The water/steam (again: liquid or vapor) provides an absorption of the infrared (IR) and ultraviolet (UV) portions of the solar spectrum thereby heating the water and optically filtering the transmitted visible (VIS) portion of the solar spectrum which is later converted into electricity via photovoltaics. The hot water can be used as is; or can drive a solar-thermal device, including but not limited to Sterling engines, which can also create electricity. This use of water to perform optical filtering permits higher levels of solar concentration in the collection optics without damaging the photovoltaics (PVs) while eliminating the need for cooling the PVs and increasing PV efficiency.

In addition to steam, other materials in the water-based waveguide; including but not limited to: glass, plastic and/or metal; perform absorptive and radiative filtering. The waveguides can be designed for minimal absorption and/or scattering of the VIS (defined to be the portion of the spectrum which best matches the responsivity of the PVs used) but any absorption of the VIS is also converted into heat which is transferred into the water/steam. Herein and throughout the UV and IR portions of the solar spectrum are also referred to as the "out-of-band" spectral components. The VIS portion of the solar spectrum is also referred to as the "in-band" spectral components which for a silicon PV comprises a range of approximately 400 nm to approximately 1100 nm.

Water can also be employed to dramatically reduce loss in the transmission of the VIS over the waveguide system; thereby enabling "solar over fiber" as an efficient means of power distribution. Such solar grids enhance our renewable resource allocation (to mitigate outages from clouds or variations in loads and battery storage availability, etc.). They also enable new applications such as a secure optical power grid as they (being e.g., comprised of glass fiber rather than metallic electrical power cabling) are immune to electromagnetic interference from: lightning; solar flares; coronal mass ejections; EMP (electromagnetic pulse) attacks, etc.

The advances disclosed in this invention also permit efficient power distribution through the existing plumbing of water distribution networks. Similarly, these also permit efficient power distribution through the existing ducting of telecommunication networks. Moreover, the VIS energy to be distributed could come from energy efficient LEDs (light emitting diodes) rather than the collection optics of a solar energy system. In which case power could be securely sent "over fiber" from any source, including but not limited to wind energy collectors with the turbines of a windmill driving energy efficient LEDs to transmit energy over optical waveguides (of glass or plastic) to a grid or converter without the use of "copper" (any metallic cabling, which would draw lightning).

While the advantages of the immunity of glass and plastic to electromagnetic interference are numerous—the enhanced photovoltaic and solar-thermal capabilities enabled by these new waveguide filters are equally impressive. The transmission and filtering abilities are both enhanced via designed incorporation of what we will refer to as the "expansion effect," which is actually a balancing of opposing effects in the interaction of light and steam. This automatic feedback stabilizing mechanism is briefly summarized as follows. As light is absorbed by the steam, the steam heats up and so (at a given pressure) it will expand and so becomes less dense; so, it absorbs less; which cools it down; so, it becomes denser; which in turn makes it absorb more—the cycle repeats, and thus an equilibrium is achieved. This stable operating point can be designed into the system or it can be controlled by controlling the pressure of the steam.

Our embodiments utilize the steam density to control the transmission properties of the waveguide system: such as how much of the light is in glass or in steam; and by setting the index of refraction between the glass and steam we can alter the scattering losses. We also utilize and control the steam density to alter the amount of IR (and UV) absorption, which can affect the operating temperature and longevity of the system. Herein we also disclose how we can reduce transmission losses for the VIS by an astounding amount, while still maintaining a very large attenuation of the IR (and UV).

In another application these waveguide systems are also used to remove contaminants from water. Biological contaminants are efficiently killed from the high levels of UV light (which we wish to filter out for the PV part of the system anyway) and the resulting debris provides a useful fertilizer. Such fertilized water could be distributed by leaking it out of the solar over fiber grid into a farm (while also distributing power and water) and/or the fertilized water could feed plants in a hydroponic system.

Additionally, other contaminants can be chemically decomposed in the high optical intensity of these water-based waveguide systems and the less harmful byproducts are economically dispensed with or utilized.

Further objects and advantages of this invention will be apparent from the following detailed description of the presently preferred embodiments which are illustrated schematically in the accompanying drawings.

BRIEF DESCRIPTION OF THE FIGURES

The drawing figures depict one or more implementations in accord with the present concepts, by way of example only, not by way of limitations. In the figures, like reference numerals refer to the same or similar elements.

FIG. 2a(i) and FIG. 2a(ii) shows an end-fired optical waveguide comprised of water (again: including steam of any density) in a glass tube.

FIG. 2b shows a mode-coupled waveguide where sunlight from collection optics is coupled into the glass tube via a transfer element into the glass.

FIGS. 3a(i), 3a(ii) and 3a(iii) shows an "evanescent mode filtering method" applied to an optical fiber (or plurality thereof, a.k.a., a fiber optic bundle) immersed in water/steam.

FIGS. 3b(i), 3b(ii) and 3b(iii) shows another embodiment where glass fibers can be replaced with (or supplemented by) glass tubes.

FIGS. 6a(i) and 6a(ii) shows the collection optics for the case of an inflatable balloon or a rigid bulb containing steam which creates a critical angle.

FIG. 6b(i) shows the inflatable balloon with tethers including optical cabling.

FIG. 6b(ii) shows the inflatable balloon/rigid bulb of FIG. 6a with mode-coupled PV.

FIG. 6b(iii) shows bulbs blown out from glass tubes, to form lensed-preforms, which can be drawn out into PCF.

FIG. 6c(i) shows the balloon coated with reflective material to form a mirror with optics to direct light into a transmission waveguide and the tether to orient to the sun.

FIG. 6c(ii) shows a lens on a gimbal, enclosed in a rigid bulb, to direct light into a transmission waveguide with radiation pressure to orient the lens to the sun.

FIG. 6c(iii) shows the inflatable balloon/rigid bulb of FIG. 6a with steam density controlled to form a lens.

DESCRIPTION OF THE PREFERRED EMBODIMENTS

Before explaining the disclosed embodiments of the present invention in detail it is to be understood that the invention is not limited in its applications to the details of the particular arrangements shown since the invention is capable of other embodiments. Also, the terminology used herein is for the purpose of description and not of limitation.

In the Summary above and in the Detailed Description of Preferred Embodiments and in the accompanying drawings, reference is made to particular features (including method steps) of the invention. It is to be understood that the disclosure of the invention in this specification does not include all possible combinations of such particular features. For example, where a particular feature is disclosed in the context of a particular aspect or embodiment of the invention, that feature can also be used, to the extent possible, in combination with and/or in the context of other particular aspects and embodiments of the invention, and in the invention generally.

In this section, some embodiments of the invention will be described more fully with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will convey the scope of the invention to those skilled in the art. Like numbers refer to like elements throughout, and prime notation is used to indicate similar elements in alternative embodiments.

Figures 1, 2:
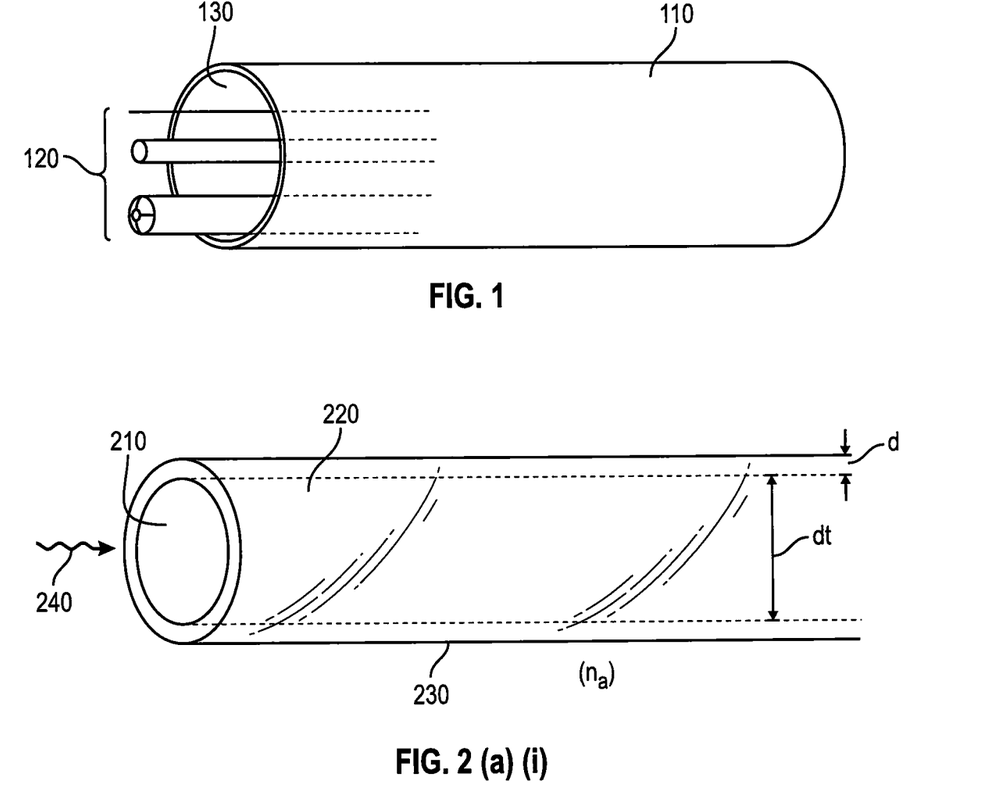
FIG. 1 shows a sheath to provide mechanical rigidity and redirection of scattered light for a single or plurality of optical waveguides all of which can be immersed in steam of any pressure.
Figure 2:
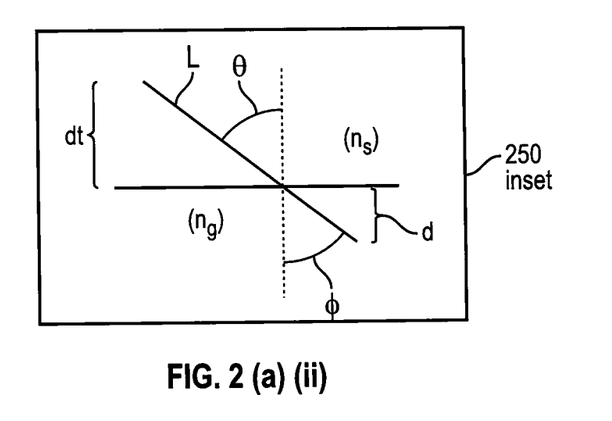

In all embodiments, as in FIG. 1, a sheath 110 of plastic or metal can be used to provide mechanical rigidity for a single or plurality of optical waveguides 120 of any type, including but not limited to bundles of fiber or glass threads (with or without cladding); photonic crystal fiber (PCF); glass tubes; etc., all of which can be immersed in steam of any pressure 130 including liquid water (with or without contaminants or intentional additives). A metallic sheath can assist in the electromagnetic guidance within the optical waveguide and can shield out electromagnetic interference, as it need not serve as part of an electric power distribution cabling (as it typically would be in the standard electrical power distribution system).

In our embodiments such a metallic sheath can be formed simply and inexpensively via the spraying of a metallic paint (e.g., an aluminum spray paint) on the waveguide—because it doesn't have to function as a conductor of electricity it can be very thin, which makes it cost-effective and lightweight. Such a spray-painted sheath collects light otherwise scattered out of the propagation modes of the waveguide, thereby dramatically reducing their optical loss; and the lightweight enables long cabling for buoyant balloon-type collectors.

FIG. 2 (a)(i) depicts the preferred embodiment in which the optical waveguide is comprised of water (again: including steam of any density) 210 in a glass tube 220. As long as the steam has a higher index of refraction than the material 230 outside the glass tube, typically air, there will be a critical angle at the glass/air interface (although there need not be one at the steam/glass interface) thereby confining the mode via TIR (total internal reflection) as shown. The steam is for reducing in-band transmission loss and increasing out-of-band transmission loss of the light spectrum while distributing heat; wherein the term in-band for a silicon PV comprises a range of approximately 400 nm to approximately 1100 nm.

In the ray-optics perspective any end-fired light 240 launched within the acceptance angle set by the critical angle will bounce between such points, thereby spending more time in the water than in the glass by a factor of $(F)(d_t/2d)$, where $d_t$ is the diameter of the tube, d is the thickness of the wall of the tube, and F is a factor close to one which, from the trigonometry of the inset 250 (FIG. 2(a)(ii) is $F=(\cos[\sin^{-1}\{(n_s/n_g)\sin(\theta)\}])/(\cos(\theta))$ and calculation shows that F will remain below 1.075 for an index of refraction in glass $n_g=1.41$, and an index of steam $n_s=1.325$, when $\theta<\theta_a$ where $\theta_a$ is the critical angle given by $\theta_a=\sin^{-1}(n_a/n_s)$ and $n_a=1$ is the index of air.

We might also evanescently mode couple to such a waveguide as depicted in FIG. 2 (b) wherein sunlight 260 from the collection optics 270 of the system (comprised of a plurality of lenses and mirrors, etc.) is coupled into the glass tube via a transfer element 280 into the glass wherein it undergoes TIR; rather than being end-fired into the entire glass-water waveguide. Within this mode-coupled embodiment the transfer element 280 could be any of the other waveguide systems disclosed herein, such as optical fiber or another section of glass tube, etc., as long as it flares out to encompass a lip (a region of contact) 290 along the present glass tube. The length of this region of contact is set for maximal power transfer of the wavelengths preferred by the PVs used. The transfer element 280 could also be a balloon-type structure which can also serve as the collection optics 270 of a system, and it also could contain steam—the scattering from which can guide the sunlight into the balloon skin to be mode-coupled into the glass tube and such scattering can direct the sunlight to be end-fired into the entire glass-water waveguide.

The end-fired modes of FIG. 2 (a) would have a ratio of field-in-water to field-in-glass given as above. The mode-coupled into glass modes of FIG. 2 (b) would experience TIR within the glass but their evanescent field can extend into the water by a very large amount when the frequency of this mode approaches cutoff. Cutoff is the point at which the exponential decay constant of the evanescent mode, a, in the transverse direction, goes to zero and the mode is no longer confined by TIR. Since the higher frequencies will have larger a, they will be more confined (for a given mode) and thus have less field penetrating into the water. Therefore, we can design a new class of waveguide filters for solar energy applications in which the lower frequency IR portions of the spectrum experience largely the higher IR absorption of water (turning that energy into useful heat) while the higher frequency VIS portions of the spectrum are more confined and experience mainly only the lower absorption of the glass. We can also use this technique with very low-density steam (like air) and have the VIS be less confined (than the UV components) and experience mainly only the lower absorption of the air. In that case the loss in the VIS is even less than it would be in normal fiber; while even the very low-density steam can be used to sufficiently attenuate the IR.

In FIG. 3(a)(i) we illustrate a preferred embodiment in which this "evanescent mode filtering method" is applied to the case of an optical fiber 310 (or plurality thereof, a.k.a., a fiber optic bundle 320) immersed in water/steam 330.

Referring to FIG. 3(a)(ii), the transverse mode pattern of the fundamental mode at a higher 334 and a lower 336 frequency are also illustrated (and the inset 338 FIG. 3(a)(iii) conveys the well-known mathematics of how the mode parameters can be determined by intersections with a circle of radius proportional to the frequency). Within standard telecommunications applications optical fibers are designed to have large confinement (large a) and the evanescent field is further restricted from coupling to the outside world via a cladding material coated about the glass core of the fiber.

In our application however we allow and exploit this coupling to the surrounding material (e.g., steam) in order to perform the desired filtering: reducing the overall transmission of spectral components of sunlight which are out-of-band with respect to the PVs used; coupling these out-of-band components into steam for solar-thermal conversion; maintaining low loss transmission of the in-of-band components (either within glass, or as below, by coupling it into even less dense media); coupling various spectral components into more complicated waveguides; etc.

The glass fibers can be replaced with (or supplemented by) glass tubes as in FIG. 3(b)(i) wherein we could have fiber(s) within tubes 340, tubes within tubes 350 FIG. 3(b)(ii), fiber(s) amidst tubes 360 FIG. 3(b)(iii), etc. The techniques disclosed herein apply to a broad range of physical dimensions. When such structures are large, the tubes might be the size of indoor plumbing and the fibers might be called "rods;" at smaller dimensions the tubes might be called "capillary tubes;" and as we go even smaller in dimension such structures might resemble some of the plethora of PCF (photonic crystal fiber) patterns of glass and air. Note in passing that when we refer to "glass" we imply a variety of materials and dopants; and "fiber" could be one of plastic (or even metal)—although the optical loss in plastic is relatively high and skin depth losses in metal require a good (hence relatively expensive) conductor to mitigate loss.

However, if a surface-wave was excited (and used) at the fiber/steam interface then fiber of plastic or metal could be useful in some applications. In all waveguides, we can control the coupling of different frequencies into regions of various density steam as exemplified above.

Moreover, when we consider multimode propagation and more complicated guidance mechanisms (as in PCF) we find that we can confine the VIS portions of the spectrum to air, or to low density steam, for longitudinal low-loss transmission of the VIS (of losses even lower than glass); and still maintain strong absorption of the IR. One reason for this is that when we improve the low-loss VIS transmission window in steam, by simply lowering its density, we can still have very strong absorption in the IR. Another reason is that steam can make the air/glass discontinuity in PCF less abrupt which can lower its scattering losses from surface imperfections ("surface-roughness scattering loss," SSL).

Steam can also introduce scattering of its own but keep in mind that any of these embodiments can be within a metallic sheath which can reflect scattering back into the steam (or other components) when then can re-scatter such back into a guided mode—therein the entire metallic sheath enclosed structure can also be considered as a waveguide, in which the other components are reducing the interaction with the sheath and its associated losses. Recall and note in passing, that these other components are also performing useful removal (and conversion to heat) of the IR (and UV) spectrum before the filtered light is distributed to the PVs (enabling the cost effective and more efficient benefits of higher levels of solar concentration at the system's input).

Returning for the moment to the simpler case of single-mode propagation via TIR in glass we disclose some illustrative numbers which demonstrate feasibility. The wall of a glass tube or the core of a glass fiber can be approximated as a dielectric slab waveguide (with trigonometric functions simplifying the actual Bessel functions involved, but we find the numbers are similar and the underlying physics is the same). For the second-order mode of a glass (refractive index=1.41) slab of 770 nm thickness, immersed in water (of refractive index=1.33) the ratio of electromagnetic-energy-in-water (obtained by squaring the electric field of the mode and integrating over the transverse dimension outside the glass) to electromagnetic-energy-in-glass (obtained by squaring the electric field of the mode and integrating over the transverse dimension inside the glass) is about ½ at a wavelength of about 400 nm; and about 8.6 at a wavelength of about 1200 nm. This demonstrates a sufficient range of ratios over a range of relevant wavelengths. We weight such ratios by the appropriate spectral attenuations (of various fiber in various steam densities) to observe the evolution of the spectral shape of such filters as a function of the length of the waveguide.

We quantify our evaluation of the quality of these shapes via the calculation of an upper and lower bound PV improvement factor and find this "evanescent mode filtering method"—relevant to FIG. 2 (b) and FIG. 3(a)(i), FIG. 3(a)(ii) and FIG. 3(a)(iii), to be a very effective technique.

Figure 3:
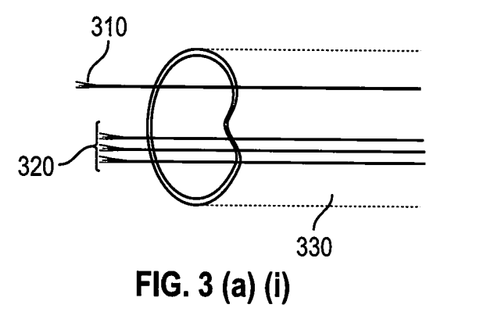

When the dimensions and separations between glass elements in FIG. 3 (b)(i), FIG. 3(b)(ii) and FIG. 3(b)(iii) become smaller we can have more complicated guidance mechanisms (as in PCF) and this enables more possibilities. Therein we can even have the field confined in regions of less density (lower index of refraction) via the other structures serving as mirrors or Bragg reflectors in the transverse direction. Whereas TIR is impossible when the wave is going from less dense into denser media. Yet, the end-fired water in a glass tube is actually an example of such "other structures serving as transverse mirrors" (wherein there is just TIR at the final interface).

Just as in the end-fired water in a glass tube case, we can have the majority of the field in a region of very low density and hence very low optical loss e.g., air. "Inhibited coupling" is another term given such similar guidance mechanisms and a hollow-core air-filled PCF with one ring of glass tubes has recently demonstrated (Debord, et al., Optica Vol. 4, No. 2, February 2017) low loss transmission in the VIS: e.g., about 1.2 dB/km at about 700 nm (and higher loss in the IR: e.g., about 200 dB/km at about 1200 nm).

Although this PCF has better attenuation of the IR than standard telecommunications grade fiber (of about 0.5 dB/km at about 1200 nm) it still transmits more IR than we would like for our application. Liquid water has an astounding loss of about $10^8$ dB/km at 1200 nm. Thus, its loss of about 62 dB/km at 700 nm can be dramatically reduced by using a lower density steam, while still absorbing virtually all of the IR, in a medium which is ideal for transferring the resulting heat into a solar-thermal energy converter. Thus "we need water." But we don't want to just "boil it all off."

Thus, it is important that we utilize the aforementioned feedback mechanism to provide a stable operating point; and FIG. 4(a), FIG. 4(b) and FIG. 4(c) details an example of how we can control that operating point by controlling the density of the steam, by controlling the steam pressure. Recall: "as light is absorbed by the steam, the steam heats up and so (at a given pressure) it will expand and so becomes less dense; so, it absorbs less; which cools it down; so, it becomes denser; which in turn makes it absorb more—the cycle repeats, and thus an equilibrium is achieved."

Figure 4:
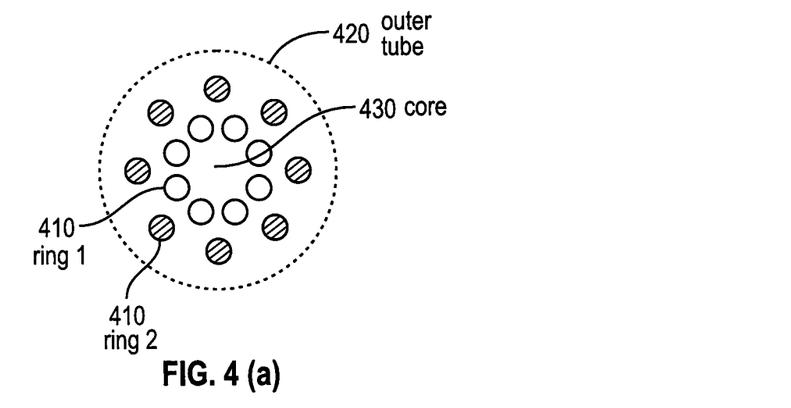
FIGS. 4a, 4b, 4c and 4d shows rings of capillary tubes within an optional glass outer tube, and each area is of steam which has a steam density controlled by valves.

In the preferred embodiment of FIG. 4 (a) we utilize a transverse topology similar to a several ring hollow-core PCF but the dimensions could be larger (or the same, in which case we would immerse such a PCF in steam within some outer tube, sheath or plumbing). This is an example of the "tubes within tubes" 350 topology of FIG. 3 (b)(i), FIG. 3(b)(ii) and FIG. 3(b)(iii) in which rings of glass tubes 410 FIG. 4(a) contain steam of different pressures, hence different densities. These rings of capillary tubes 410 could be within some, perhaps glass, outer tube 420 (or not, in which case the hollow-core 430 they surround is of air).

When we use an outer tube 420 the inner-core area 430 (and surrounding) is also of steam; and the steam density of each of these areas and tubes is easily controlled by tightening (or unrestricting) mechanical valves 440 FIG. 4(b).

For simplicity of illustration FIG. 4 (b) depicts the case of two rings of glass tubes 410 and the valves 440 effected via rubber or plastic "O-rings" with O-ring 1 pressing against optical tube ring 1, etc., and as in FIG. 4 (c) the force on the O-rings; could be controlled via a screw plate 450 or a voltage on a piezoelectric element 460; and this controls the steam pressure by restricting the flow rate at the water inlet 470 and water outlet 480, schematically illustrated in FIG. 4 (d). Of course, the steam pressure of each tube within a ring could also be individually controlled in a similar fashion.

Figure 5:
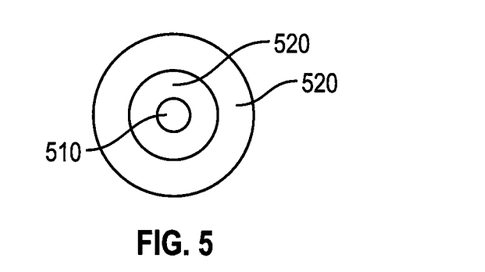
FIG. 5 shows concentric tubes, with individual control of steam pressure within each region.

In the preferred embodiment of FIG. 5 we utilize concentric tubes, and therein individually control the pressure of the steam within an inner region 510, concentrically within each region 520 between each tube, in the transverse topology depicted. Again, the tubes can be made of glass (or plastic) and various levels of dopants and/or coatings could be used in/on the various tubes to inhibit the electromagnetic coupling between each region.

In the embodiments depicted in FIG. 4(a), FIG. 4(b) and FIG. 4(c) and FIG. 5 our control of the steam densities of the various regions is also utilized to shape and confine the electromagnetic modes of the waveguide. Some embodiments will have metallic sheaths to redirect scattering from higher density steam and in these cases, we wish to confine the modes away from the sheaths to restrict the loss they induce. In these and as well as other embodiments confinement of the modes to a lower steam density core area is important for the sake of reducing loss in transmission of the VIS.

We can think of the outer regions, e.g., the rings depicted in FIG. 4(a), FIG. 4(b) and FIG. 5, as a "cladding" and we might want some coupling between the core and the cladding in order to absorb more IR in a higher density of steam region; but we certainly want to be able to design and control this amount of coupling and its frequency dependence.

To achieve that we utilize the effect that steam density has on the index of refraction (by which, as in common practice, we actually refer to the real part of the index of refraction, which sets the speed of propagation; whereas the imaginary part of the index of refraction sets the optical loss). By controlling the steam density in the rings around the core we also control the difference in the propagation speeds of the core and cladding modes. This difference in speeds can be used to reduce the coupling between the core and cladding modes, thereby allowing us to enhance the confinement of the energy to the core. Moreover, in addition to simply enhancing the inhibited coupling guidance mechanism—we can control this process, as disclosed above, and we find this "controlled coupling filtering method" to also be a very effective technique.

Figure 6:
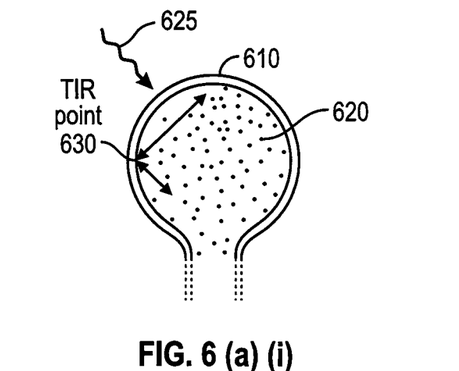

The optical scattering from steam is utilized to our advantage in the embodiment of FIG. 6 (a)(i) and FIG. 6(a)(ii) in which the collection optics of the entire system (normally Fresnel lenses and/or parabolic mirrors) is now an inflatable balloon or a rigid bulb 610 (an enclosure, like an incandescent lightbulb, of any shape including but not limited to a sphere or other ellipsoid) which contains steam 620. Referring to FIG. 6(a)(i), sunlight 625 passing into this (possibly plastic) balloon or (possibly glass) bulb will scatter from the steam into many angles and many of these will be at an angle beyond the critical angle of the glass/air or plastic/air interface; and such a critical angle 630 FIG. 6(a)(ii) exists, similar to the embodiment of FIG. 2 (a)(i) and FIG. 2(a)(ii), because the enclosed steam 620 has a higher index of refraction than the surrounding air. This is as shown in the inset 640 FIG. 6(a)(ii) which shows the k-surfaces and how this is independent of material (glass or plastic) between the steam and the air.

To be sure such an otherwise trapped light ray will encounter further scattering from the steam and some of these will be into angles smaller than the critical angle; but the efficiency of such a collector is aptly compensated by its simplicity. This simplicity translates into cost effectiveness in: its manufacturing; the absence of a sun-tracking system; and installation (with respect to the use of lenses or mirrors).

Moreover, since we then transmit the solar energy over spectrally filtering waveguides, the PVs could be anywhere, including inside a building rather than on its rooftop so the installation of the entire system can be reduced to being as simple as "blowing up a balloon." This is a huge cost saving as installation of conventional PV panels on rooftops can be a limiting factor. The use of inflatables also expedites rapid deployment in military applications. Through our use of steam, the inflation process is also simplified: one simply lets the system heat up and the steam will automatically inflate a balloon.

As also in the rigid bulb case it is like wrapping up a cloud and tapping off some light, while also allowing some to pass—which also prevents an unwanted total shadowing of neighbors and plant life. Such systems could be quite large: weather balloon scale, tethered by their "solar over fiber" cabling 650 and perhaps by other tethers 655 such as fishing line, as in FIG. 6 (b)(i). Floatation of the larger balloons could be supplemented by Helium. These have the further advantage of zero-footprint on Earth; which is especially important in highly residential areas, where energy needs and real-estate costs are high. Or such systems could be on a residential scale: resembling a tree in one's backyard with perhaps the rigid bulb collector spreading in size at the top of a glass tube of diameter the size of a tree trunk, around which a sheet of flexible PV is wrapped.

The water inlet to such a residential scale system could most simply be controlled via a normal valve on a garden hose and the water outlet could go to a hot water tank: for local use; energy storage; and/or solar-thermal energy conversion. Or such systems could be on a smaller scale: forming balloons or bulbs suitably sized so that an array of which can hang off of, or float above: a porch; a window; a car; or a backpack. Note in passing that in all cases the balloon/bulb can be of any shape: including ones with a flatter surface directed towards the sun to minimize reflection; leaf type shapes; etc., but the ellipsoidal shapes require less orientation control.

In all of such embodiments the interface of the steam filled collector with the steam filled waveguide filter can be with or without an entrance optics 660 which can not only serve as an additional optical filter but also as a mechanical partition if we want the pressure of the steam in the collector to differ from that in the waveguide. In all of such embodiments the interface of the steam filled waveguide filter with the PVs can be via evanescent mode coupling by wrapping flexible PVs around a glass tube. If smaller diameter "solar over fiber" cabling has been used, we can also employ the previously mentioned transfer element 280 to flare this out to encompass a lip (a region of contact) along larger diameter glass tube, placing the energy in the "mode-coupled into glass" modes of FIG. 2 (*b*) where it can more readily evanescently couple into flexible PVs wrapped 670 around such, as shown in FIG. 6 (*b*)(ii).

The transfer element could also flare any optical cabling or tube into a flat glass slab 680 which can be placed on flat PVs 685 to similarly couple the energy while also serving as a cover for the PVs. In all cases the PVs could be indoors; or outdoors in which case they also receive conventionally incident sunlight. Glasses are readily blown or drawn or melted into such shapes but plastics could also be used in some applications and both classes of materials are cost effective for mass production. Bulbs can be blown out from tubes; even stacks of capillaries, a.k.a., PCF "preforms" (and we blowout a bulb on each).

These will be referred to as "lensed-preforms." Referring to FIG. 6(*b*)(iii), these could be drawn out into PCF 688 or left as capillary tubes 690 and the bulbs could be larger than the tube diameter 694 or small raised surfaces 696 of the same diameter.

FIG. 6(*c*)(i) depicts a variation on this theme. One side of the (possibly plastic) balloon or (possibly glass) bulb 610 could be coated with a reflective material (such as metallic-paint, e.g., aluminum-based or other spray paint) to form a mirror 697; and the entrance optics 660 could be lensed preforms or simply a secondary reflector to direct light from said mirror into the optical transmission waveguide 650; and the radiation pressure on said mirror can automatically orient it towards the sun—assisted by control of the tethering 655 in the case of an inflatable balloon.

FIG. 6(*c*)(ii) depicts another variation in which a lens on a gimbal is enclosed in a rigid bulb to direct light into a transmission waveguide; with radiation pressure from the sunlight again assisting in orienting the lens to the sun. The entrance optics 660 at the focal point of the primary mirror or lens 697 could also be simple preforms, or even PCF, or capillaries, without any lensing at each end; and simply bending these open-ended tubes replaces the function of a secondary reflector so that each functions like a horn antenna.

Alternatively, or in conjunction with mirroring techniques, we disclose lensing techniques: therein we control the spatial distribution of the density of the steam within the collector 610 to form a lens, as in FIG. 6(*c*) (iii). For example, a convex lens could be formed via steam inlets 699 being placed more centrally than steam outlets 699. Moreover, as the steam inlets and outlets can be capillaries or PCF (which can also serve in the optical transmission waveguide 650) these are easily arrayed into more complex patterns to form more complex lensing and wave guiding options. Control of steam density (ranging from normal air to liquid water) within such illuminated environments also controls whether the steam will resemble an atmosphere of some index of refraction or if the water molecules will aggregate into larger domains and thereby scatter more like a cloud.

With or without such mirroring and/or lensing embellishments these balloon/bulb collectors perform well in the collection of ambient light from many directions simultaneously—making them ideal over snow covered ground or over a body of water. An array of such floating on water (like a "solar lily pond") would make a cost-effective use of our natural resources. Moreover, the heat conducted into the water via our optical waveguides would not warm it more than the incident sunlight would have; and such power cabling cannot "short circuit" in water while it safely distributes to PVs on land or inside buildings, whereas electrical cabling from PVs placed over water is a daunting proposition.

Turbulence on the body of water's surface (swimming pool, pond, lake or even ocean) is not a problem since the collectors don't have to be pointed and the cabling can be at depths where boat traffic can't encounter.

We also lay claim to the use of stimulated scattering processes (e.g., Stimulated Emission of Radiation, SER, Stimulated Raman Scattering, SRS, Stimulated Brillouin Scattering, SBS, etc.) which can perform amplification of a guided wave; as in a fiber amplifier, also in a fiber laser; wherein the pump field is the incident sunlight. In these stimulated scattering processes: the guided wave provides a preferred direction for the scattered light thus aiding in the collection of the sunlight into the wave-guided modes.

In U.S. Pat. No. 8,710,353 to Shepard, which is incorporated by reference in its' entirety, we spoke of applying this technique to rod and tube waveguides; herein we extend that method to the skin of a balloon or bulb collector, which functions as a waveguide. This region of preferred scattering direction can also be created within the inside of our balloon or bulb collector by placing a reflective surface (e.g., aluminum or other spray paint on a spot on the skin) opposite to the entrance optics 660 which functions as the partially transmitting mirror of this laser cavity.

Of course, such a region could be encased in a glass tube in order to distinguish its steam pressure from that of the rest of the balloon or bulb collector; and dopants can be added to the steam and/or plastic and/or glass surfaces to aid in the process in ways well known to the EDFA (Erbium doped fiber amplifier) and Raman and Brillouin fiber amplifier and laser industries. To aid in the preferred direction aspect the balloon/bulb skin can also be comprised of longitudinal strips—each strip being a waveguide.

Similarly, texturing of the inside and/or outside of the balloon or bulb skin can produce a lensing, a mirroring, or more generally a "light-trapping" effect. A simple example would be the etching of rings of concentric grooves, as in a Fresnel lens or a zone plate. The texturing might consist of an array of conical or hemispherical sputtering onto the skin; or an infusion of photonic crystals or plasmonic nanoparticles into the skin. Note that a variety of light-traps have been considered for the top and back surfaces of a PV with conventionally incident light "from the top." Within the present invention however we replace or supplement that with light (collected elsewhere) which is imported "from the side" in the sense that it comes from a waveguide which is evanescently mode-coupled to a PV, as depicted in FIG. 6 (*b*)(i), FIG. 6(*b*)(ii) and FIG. 6(*b*)(iii).

Thus, although many light-trapping schemes exist, one of the novel aspects here is the application of such to trapping within a balloon or bulb collector, for transmission over optical waveguide to then evanescently mode-couple to a PV (whereas normally a light trap is only used for conventionally incident light).

As another example of how existing light-traps can be utilized within our novel balloon/bulb type collectors we could make the skin out of woven optical fiber, slightly melted or fused to make an air-tight skin, in which case these are then mode-coupled to our optical cabling 650 or they could be unwoven at the edge to form a fiber bundle within our cabling.

The present invention is not limited to the aforementioned solar energy wave-guiding and filtering techniques as it also very much concerned with the integration of such into "solar energy networks." Such solar grids, enabled by the above, enhance our allocation of renewable resources while they also enable a more secure (optical) power grid as they are immune to electromagnetic interference, EMI.

Figure 7:
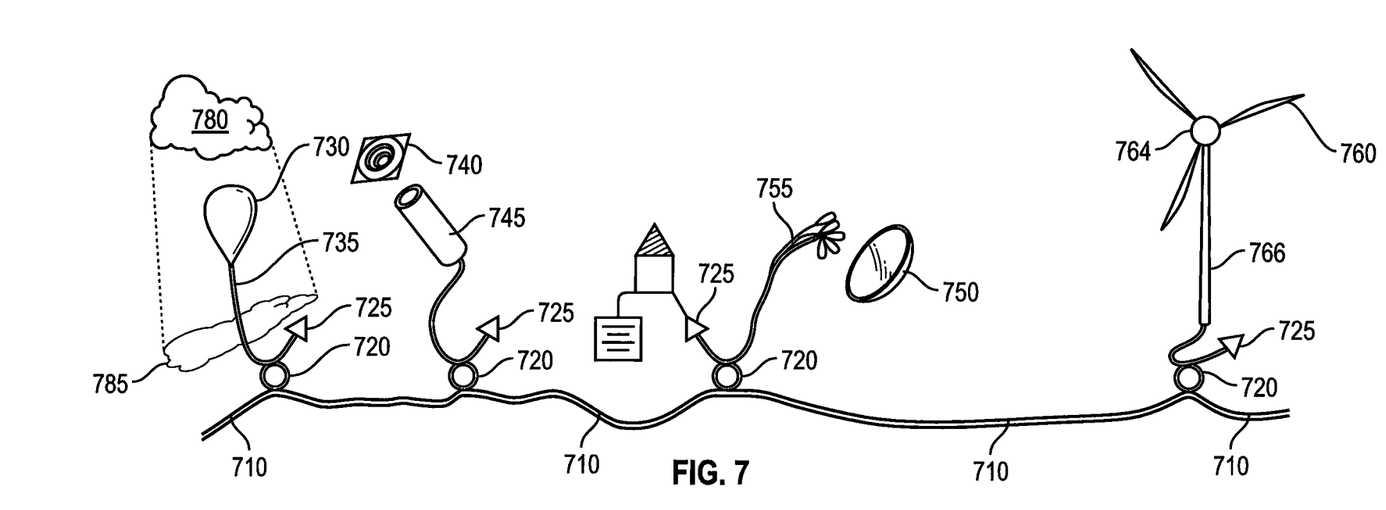
FIG. 7 shows networking with feeders to connect to the optical backbone which connects to feeders via controlled couplers, with network control via optical/electrical/wireless controlling the valves with local power use and storage capabilities at each feeder site.

FIG. 7 illustrates some of these networking embodiments. Therein we show just a few of the possible "feeders" which connect to the optical backbone 710 which is comprised of any of the aforementioned water-based waveguide systems. The backbone connects to the feeders via controlled couplers 720 which could be implemented via a variety of technologies, including but not limited to those of ROADM (reconfigurable add/drop multiplexers) as in optical telecommunications networks. If we desire to use such in an all-optical network their control could be via optical signals and they could be powered by tapping off some of the solar energy into photovoltaics dedicated for such purpose.

Alternatively, the controlled couplers 720 could simply be fixed couplers (as simple as two waveguides in sufficient proximity to permit evanescent mode coupling) and the ratios of up-streaming and down-streaming to the backbone simply set upon network installation. Network control can also be via optical or electrical (even wireless) signals directing the settings of valves which control the various steam pressures. The local power use and storage capabilities 725 at each feeder site is denoted by a triangle and these could involve a building, factory, residence, battery or capacitor storage, solar-thermal energy converters or nothing at all.

Each feeder in FIG. 7 is comprised of a collector and a filter/cabling element: a balloon/bulb 730 connected to our optical cabling 735; a Fresnel lens 740 focused onto a water filled glass tube 745; and a parabolic dish mirror 750 with a lensed-preform 755 at its focal point. These combinations are chosen simply for the point of illustration and are not intended to represent any optimal pairing. For example, a bulb on top of a tube works nicely; as does a preform or a lensed-preform pointed upwards, rather than pointed towards a parabolic mirror—which could be eliminated. In many applications one would prefer to not use Fresnel lenses or parabolic mirrors due to their tracking complications.

However, the parabolic mirror in FIG. 7 is also taken to represent the case of a CSP (concentrated solar power) station in which many ground-based mirrors focus sunlight to an area near the top of a water tower; and it is easy to retrofit a steam filled glass tube with a flexible PV wrapped around it to such a system (particularly since it already utilizes steam).

Also, the VIS energy to be distributed could come from energy efficient LEDs rather than the collection optics of a solar energy system. In which case power could be securely sent "over fiber" from any source, including but not limited to wind energy collectors with the turbines at a windmill 760 driving energy efficient LEDs 764 to transmit energy over optical waveguides 766 (of glass or plastic) to a grid or converter without the use of "copper" (any metallic cabling, which would draw lightning).

FIG. 7 also depicts a cloud 780 and its associated shadow 785. Clouds are a major source of outages in solar energy systems, but it's never cloudy everywhere at the same time! Thus, even in a less dynamic network utilizing fixed couplers, the system automatically ensures that each node (or feeder site, as each user is also a feeder) receives solar energy—whether that node is shadowed by clouds or not. This also means that, even in a fixed coupler network, all of the storage facilities (batteries, capacitors, heat storage elements) are recharged and resupplied throughout each day— "rain or shine."

Cloud outages can also be circumvented, in the case of buoyant balloon collectors, by simply making the optical cabling long enough to float the balloons above the clouds— particularly because the invention permits low-loss transmission of the VIS. For example, if the clouds are below 3 km then normal optical transmission at say about 1 dB/km would incur 3 dB of loss, so we would receive about ½ of the transmitted power. This could be compensated for via doubling the collection area of an inexpensive but efficient balloon collector, however we can improve on that as follows. In normal fiber (or solid-core PCF) we can make the evanescent field contain about 4 times as much energy in air as the guided energy has in glass (as in the "evanescent mode filtering method").

In hollow-core PCF the same factor can happen as about 80% of the energy is in air. Moreover, the loss at VIS in fiber is primarily due to scattering (rather than absorption) so this energy can be recaptured via the use of a metallic sheath around the bundle of optical fiber, which can be cost-effectively realized via aluminum-based spray paint (or some other reflective paint). The paint is lightweight. It is very thin because it is not being used as a conductor. This also makes it inexpensive, in material costs and manufacturing costs. We can also do likewise on Earth-based cabling and now the scattering is collected (apart from the skin-depth based losses of reflection from the metallic-paint).

Returning to the above example, with about 80% of the energy in air and 20% incurring a loss of ½, we would receive about 90% of the transmitted energy (instead of ½). As another numeric example, consider an about 10 km metropolitan backbone hollow-core PCF link with about 1.2 dB/km loss at 700 nm. Rather than suffering a about 12 dB loss; with about 80% of the energy in air, we would receive about 81.26% of the transmitted energy. Clearly this "levels off" at whatever percentage of the energy is in air (for longer or higher loss links) and for more realistic long link estimates we would have to include the skin-depth based losses of reflection from the metallic-paint, but that won't be overwhelming since it is incurred only by energy which is scattered from the otherwise guided mode.

If we also wish the cabling to perform absorptive filtering of the IR (and perhaps transfer the resulting heat to a ST converter) we can add water vapor, i.e., steam, to the air. At a density of about $10^{-3}$ that of liquid water we reduce the roughly about 62 dB/km of loss at about 700 nm, to essentially zero. If we also wish to reduce the roughly about 6000 dB/km of loss at about 900 nm, we might lower the density down to about $10^{-4}$ that of liquid water; but even at such low density steam we would still have over about 10,000 dB/km of loss at about 1200 nm—thereby still providing an enormous amount of useful absorption of the IR.

Note in passing that the large-scale balloon type collectors are only feasible when used in conjunction with our new optical cabling methods. The weight alone of PVs placed inside such a large-scale buoyant balloon would be prohibitive; and at such high optical intensities these would require extensive cooling systems and thick electrical cabling which further prohibit such a system from "harvesting the sky" in such a way. The location of balloons of cloud level height can be in coordination with the restricted flight zones of cities and military bases. The locations could also be near electrical power grid sites to minimize electrical cabling losses from PVs, if we are not interfacing with an optical power grid.

If the backbone 710 FIG. 7 is also carrying information in either the O-band, C-band or L-band—all further into the IR than, for example about 1125 nm (where the responsivity a silicon PV drops to zero) then we want to ensure that the solar energy at those IR wavelengths has been sufficiently attenuated within the feeders so that it can't interfere with communication on such a shared (power and information) network.

The backbone 710 FIG. 7 could be an existing telecommunications network but the relatively high loss in the VIS, e.g., about 4.5 dB/km at 700 nm, would limit the transmission distances or require more compensation via higher levels of concentration in the collectors. Longer distances could be utilized, at the same concentration levels, if such telecommunications networks were supplemented with our water-based waveguides within the same ducting. Note ducting is a major cost in the prospect of laying new fiber. The advances disclosed in this invention also permit efficient power distribution through the existing plumbing of water distribution networks. Therein the ducting also already exists.

The importance of providing a secure power grid: for military infrastructure to be secure from attack (via the electromagnetic pulse, EMP, created by the explosion of a nuclear device); for hospitals and all of our society to be secure from natural disasters (such as coronal mass ejections, CME, which could destroy our entire electrical power grid) mitigates the cost of ducting and installing an entirely new backbone 710 for many applications.

The natural immunity of glass (and plastic) to electromagnetic interference, as opposed to the lack thereof in metallic power cabling, makes these networks a nature choice for proving a secure power grid as well as a secure communications network. In addition to protecting us from EMP and CME disasters such networks would not suffer outages from lightning or solar flares. Moreover, "there is nothing to short out" on such a power distribution network so it could safely be located underground—just as our fiber and water distribution networks are.

Figure 8:
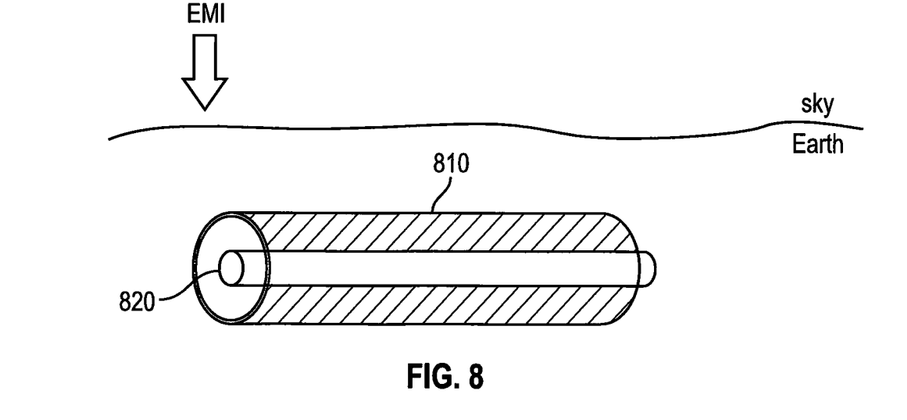
FIG. 8 shows the underground use of a metallic sheath around our optical waveguide.

As depicted in FIG. 8 this underground aspect only assists in our immunity to EMI and that can be further enhanced through the use of a metallic sheath 810 around our optical waveguide 820 since the sheath is not connected to any hardware! It is grounded and thus can only serve to further shield any EMI or particle radiation which might penetrate the Earth. Note such a metallic sheath is often already present when we deploy our water-based waveguides within existing water distribution networks. Moreover, this underground aspect brings a huge advantage by eliminating the destruction of power lines from storm damage: no more downed power lines from trees falling on them during high winds or hurricanes knocking over their posts. In addition to the security value for vital infrastructure, the cost savings in power network repair would be very significant.

Figure 9:
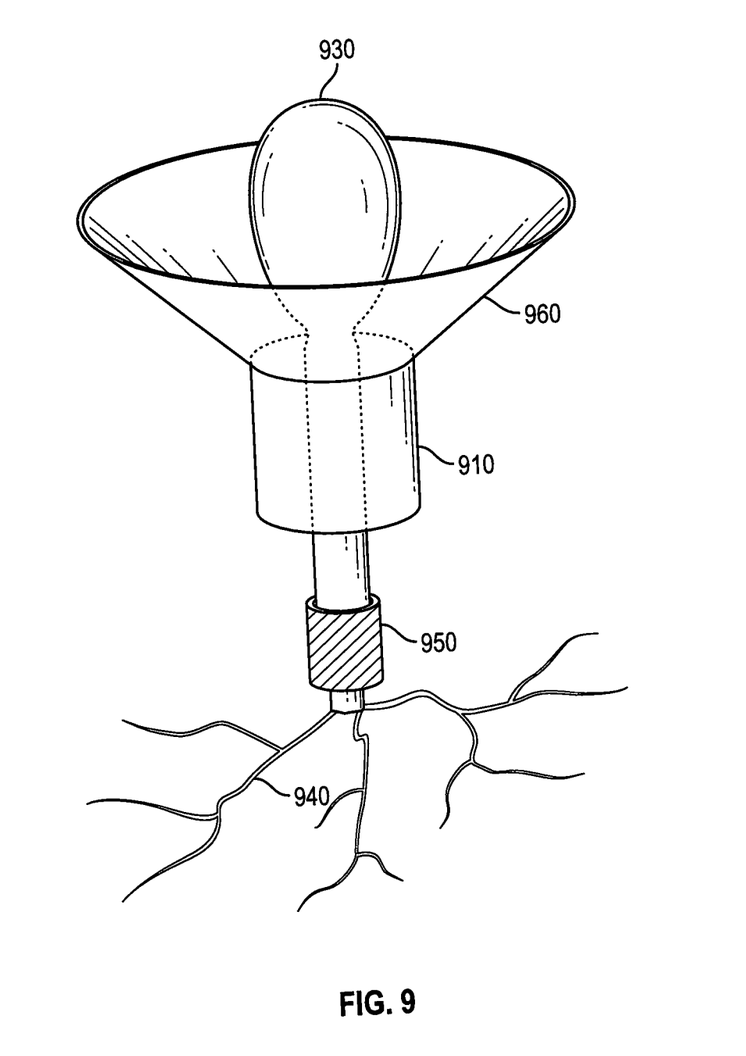
FIG. 9 shows a low-tech embodiment of a water purification and irrigation system which utilizes our bulb/balloon collector and solar-tree.

In another application these waveguide systems are also used to remove contaminants from water; as well as provide irrigation as depicted in FIG. 9. Biological contaminants are efficiently killed from the high levels of UV light (which we wish to filter out for the PV part of the system anyway) and the resulting debris provides a useful fertilizer. Such fertilized water could be distributed by leaking it out of the solar over fiber grid into a farm (while also distributing power and water) and/or the fertilized water could feed plants in a hydroponic system.

Additionally, other contaminants can be chemically decomposed in the high optical intensity of these water-based waveguide systems and the less harmful byproducts are economically dispensed with or utilized. In a low-tech embodiment rainwater can be collected in rain-barrels 910 which feed into the water-inlet near the top of a solar-tree equipped with a balloon or bulb type collector 930 and the heat from the IR absorption drives the water into a stand-alone irrigation system 940 at the base of the solar-tree; all utilizing methods and systems already disclosed in the above.

A PV sheet 950 wrapped around the base of the solar-tree provides electricity—some of which could be used for valve actuators and the electronics which could control them, but in a simpler system we could just let the rainwater filter in via gravity. In all cases the rain-barrels can spread out like a funnel 960 which also serves as a mirror to focus even more sunlight into the balloon or bulb type collector. Large versions of such systems could also be retrofitted into old abandoned grain storage silos for inexpensive structural support.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A solar energy system for photovoltaic (PV) and solar thermal (ST) conversion comprising:
   at least one optical waveguide for absorbing spectral components of sunlight which are out-of-band with respect to PVs being used, and converting the out-of-band sunlight into heat which is either conducted into ST energy converters or radiated into the air so that the heat is not conducted to the PVs;
   a sheath or ducting selected from at least one of plastic or metal to provide mechanical stability and re-direct scattered light, the sheath or ducting about the at least one optical waveguide; and
   steam inside of the sheath or ducting, and about the at least one optical waveguide, the steam for reducing in-band transmission loss and increasing out-of-band transmission loss of the light spectrum while distributing heat; and
   collection optics selected from at least one of mirrors, lenses, balloons, bulbs and fiber-optic preforms.

2. The system of claim 1, wherein the at least one waveguide is an end-fired glass tube of steam, which is interfaced to collection optics via an entrance optics and the ratio of electric field filtering in the steam to electric field filtering in glass being proportional to the ratio of the diameter of the tube to twice the thickness of its wall.

3. The system of claim 1, wherein the at least one waveguide is at least one of: a mode-coupled glass tube of steam and claddingless optical fibers in a tube of steam, and the ratio of solar energy filtering in the steam to solar energy filtering in the glass tube set by the amount of evanescent field penetrating into the steam which varies with frequency and increases as that frequency approaches the cutoff frequency of that mode of propagation.

4. The system of claim 1, wherein the at least one waveguide is comprised of a glass tube containing at least one of: smaller glass tube, optical fiber, photonic crystal fiber, PCF, all in regions of different steam densities; and the steam reducing the surface-roughness scattering losses and controlling the electromagnetic coupling between regions.

5. The system of claim 4, wherein the smaller glass tubes are arrayed in rings, forming a cladding around a central hollow or low-density core while the rings contain higher density steam which inhibits the coupling between the core and cladding modes in a controlled way so as to have low loss transmission of in-band frequencies in the core mode and still provide high attenuation of the out-of-band frequencies.

6. The system of claim 5, wherein the steam density is controlled via an expansion effect which provides a stable operating point which is modified by controlling steam pressure via valves, the valves being selected from one of O-rings which are pressed via screw plates and piezoelectric elements.

7. The system of claim 6, wherein the glass tubes having increasing diameter are arrayed concentrically to form the rings.

8. The system of claim 1, wherein the collection optics is selected from at least one of an inflatable balloon and a rigid bulb which contains the steam providing a critical angle with respect to the air.

9. The system of claim 8, wherein the inflatable balloon contains buoyant gas, to assist in floatation of the balloon, tethered by optical cabling with a lightweight metallic sheath of spray paint.

10. The system of claim 9, wherein an inner portion of the balloon has metallic spray paint to form a mirror directed to an entrance optics to the optical cabling, with radiation pressure and tethering to orient the mirror to the sun.

11. The system of claim 10, wherein the entrance optics is selected from at least one of a preform and a lensed-preform.

12. The system of claim 8, wherein the rigid bulb contains a radiation pressure and gimbal oriented lens directing sunlight to entrance optics.

13. The system of claim 8, wherein the rigid bulb contains a lens formed by controlling steam density.

14. The system of claim 8, wherein mode-coupling to the PVs is selected from one of: via wrapping a flexible PV around a glass tube waveguide, and flaring a glass waveguide into a flat cover which is on top of and coupled to a flat PV.

15. The system of claim 1, wherein the collection optics is selected from at least one of a preform and a lensed-preform.

16. The system of claim 1, wherein the collection optics floats on a body of water.

17. The system of claim 1, further comprising:
networks of each system which provide a secure optical power distribution grid that is immune to electromagnetic interference from manmade attacks or from natural disasters and routes energy on the basis of availability and demand.

18. The system of claim 17, further comprising:
optical power distribution networks in underground ducting shared with telecommunications and water distribution networks which are immune to storm damage.

19. The system of claim 1, further comprising:
irrigation and water purification system for converting bio-contaminants into fertilizers and for distributing the fertilizers and water.

20. The system of claim 1, further comprising:
collection optics replaced by energy efficient LEDs driven by the turbines of wind energy collectors.

* * * * *